(12) United States Patent
Yamazawa

(10) Patent No.: US 8,261,691 B2
(45) Date of Patent: Sep. 11, 2012

(54) PLASMA PROCESSING APPARATUS

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 865 days.

(21) Appl. No.: 12/271,503

(22) Filed: Nov. 14, 2008

(65) Prior Publication Data

US 2011/0174440 A9 Jul. 21, 2011

Related U.S. Application Data

(60) Provisional application No. 61/024,399, filed on Jan. 29, 2008.

(30) Foreign Application Priority Data

Nov. 15, 2007 (JP) .................................. 2007-296406

(51) Int. Cl.
*C23C 16/00* (2006.01)
*C23F 1/00* (2006.01)
*H01L 21/306* (2006.01)
(52) U.S. Cl. ............................. 118/723 E; 156/345.47
(58) Field of Classification Search ............. 156/345.43, 156/345.44, 345.45, 345.46, 345.47; 118/715, 118/722, 723 R, 723 E; 315/111.21
See application file for complete search history.

(56) References Cited

U.S. PATENT DOCUMENTS

| 7,585,386 B2 | 9/2009 | Okumura et al. |
| 2001/0023742 A1* | 9/2001 | Schmitt .......................... 156/345 |
| 2003/0085205 A1* | 5/2003 | Lai et al. .................. 219/121.43 |

FOREIGN PATENT DOCUMENTS

JP 2004-363552 12/2004

* cited by examiner

*Primary Examiner* — Maureen Gramaglia
(74) *Attorney, Agent, or Firm* — Oblon, Spivak, McClelland, Maier & Neustadt, L.L.P.

(57) ABSTRACT

A plasma processing apparatus includes a vacuum evacuable processing chamber; a first electrode for mounting thereon a substrate to be processed in the processing chamber; a second electrode facing the first electrode in parallel in the processing chamber; and a processing gas supply unit for supplying a processing gas to a processing space between the first and the second electrode. The apparatus further includes a first high frequency power supply for applying a first high frequency power for generating a plasma of the processing gas to at least one of the first and the second electrode; and a cavity plasma generation unit, having a cavity formed in one of the first and the second electrode, for generating a plasma of a discharging gas in the cavity.

19 Claims, 6 Drawing Sheets

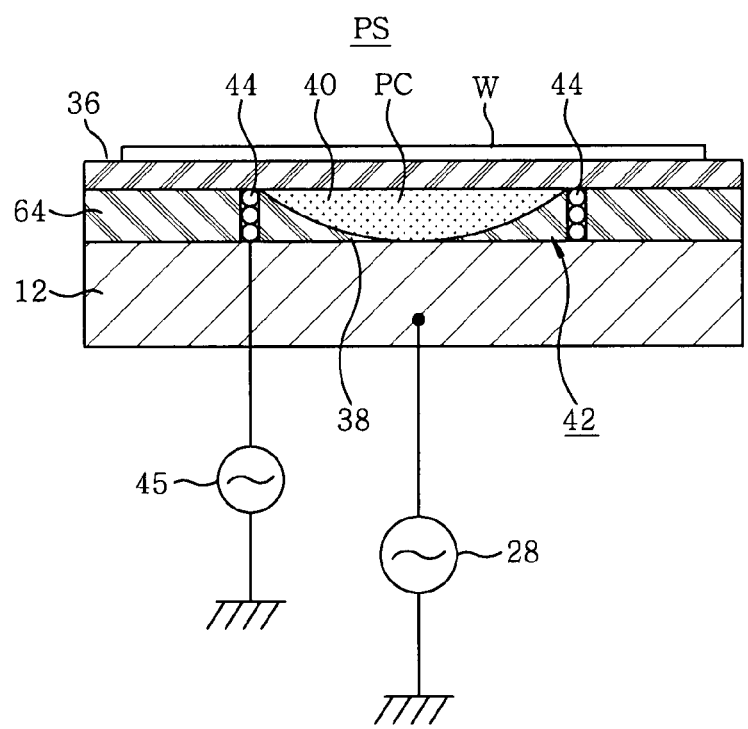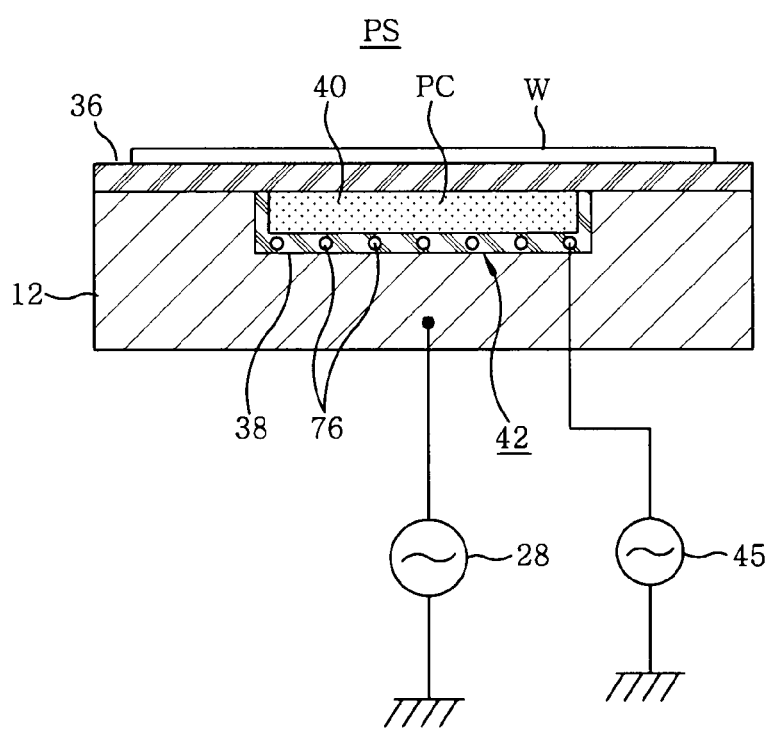

PLASMA PROCESSING APPARATUS

FIELD OF THE INVENTION

The present invention relates to a technique for performing plasma processing on a substrate to be processed; and, more particularly, to a capacitively coupled plasma processing apparatus having parallel plate electrodes.

BACKGROUND OF THE INVENTION

In a manufacturing process of a semiconductor device or an FPD (flat panel display), a plasma is often used in processes, e.g., etching, deposition, oxidation, sputtering and the like, in order to make a processing gas react efficiently at a relatively low temperature. Conventionally, a capacitively coupled plasma processing apparatus capable of generating a plasma of a large diameter is mainly used for a single-wafer plasma processing apparatus.

Generally, in the capacitively coupled plasma processing apparatus, an upper and a lower electrode are disposed in parallel with each other in a processing chamber as a vacuum chamber, and a substrate to be processed (e.g., a semiconductor wafer, a glass substrate or the like) is mounted on the lower electrode. By applying a high frequency power (an RF power) to both electrodes, electrons accelerated by a high frequency electric field formed between the electrodes, secondary electrons emitted from the electrodes, or heated electrons collide with molecules of a processing gas to generate ions. Accordingly, a plasma of the processing gas is generated, and a required microprocessing, e.g., etching, is performed on a substrate surface by radicals or ions in the plasma.

In the etching process, there is widely used a dual frequency application mode in which a relatively high frequency wave (generally greater than or equal to about 40 MHz) for plasma generation (discharge) and a relatively low frequency wave (generally lower than or equal to about 13.56 MHz) for ion attraction to the substrate (bias) are simultaneously applied to both electrodes.

Meanwhile, with increasing demands for miniaturization and high integration of devices in the semiconductor processing technique, a high efficiency, high density and low bias plasma processing is required in the capacitively coupled plasma processing apparatus. To do so, the high frequency wave for plasma generation tends to be set as high as possible. Meanwhile, along with the tendency to increase the chip size and the diameter of the substrate, the plasma is required to be of a larger diameter and, therefore, a chamber (processing vessel) is scaled up accordingly.

Here, the problem is that it is difficult to have a uniform plasma density in a processing space of the chamber (especially, in a radial direction). That is, when a discharging RF frequency increases, the profile of the plasma density becomes high at a central portion of the substrate and low at an edge portion thereof due to the wavelength effect causing formation of standing waves in the chamber and/or a skin effect making the high frequency wave be concentrated in the central portion on the electrode surface. The non-uniformity of the plasma density on the substrate leads to a non-uniformity of the plasma processing. As a consequence, the production yield of the semiconductor devices decreases.

To that end, various electrode structures have been developed. For example, in a plasma processing apparatus described in Japanese Patent Laid-open Application No. 2004-363552, uniformity in a plasma density distribution is improved by inserting a dielectric member in a main surface of an electrode facing a processing space so that an impedance to a high frequency power emitted from the main surface of the electrode to the processing space increases at a central portion of the electrode and decreases at an edge portion of the electrode.

The technique for inserting a dielectric member in a main surface of an electrode is disadvantageous in that the impedance distribution on the main surface of the electrode is fixed by a profile and a material of the dielectric member. Accordingly, a process region where the uniformity of the plasma density distribution can be controlled is small. Further, it is not possible to flexibly cope with various processes or changes of processing conditions.

SUMMARY OF THE INVENTION

In view of the above, the present invention provides a capacitively coupled plasma processing apparatus capable of easily and freely controlling a plasma density distribution and, therefore, improving a production yield or uniformity of a plasma processing.

In accordance with an aspect of the present invention, there is provided a plasma processing apparatus including a vacuum evacuable processing chamber; a first electrode for mounting thereon a substrate to be processed in the processing chamber; a second electrode facing the first electrode in parallel in the processing chamber; a processing gas supply unit for supplying a processing gas to a processing space between the first and the second electrode; and a first high frequency power supply for applying a first high frequency power for generating a plasma of the processing gas to at least one of the first and the second electrode.

The apparatus further includes a cavity plasma generation unit, having a cavity formed in one of the first and the second electrode, for generating a plasma of a discharging gas in the cavity.

In the capacitively coupled plasma processing apparatus having parallel plate electrodes, when the first high frequency wave from the first high frequency power supply is applied to the first electrode or the second electrode, the plasma of the processing gas is generated in the processing space by the high frequency discharge generated between the electrodes, and a plasma processing is performed on the substrate by radicals or ions in the plasma. Here, the uniformity of the plasma processing on the substrate depends on the plasma density. In accordance with the present invention, the cavity plasma (plasma cell) as a dielectric for applying a capacitance impedance to the main surfaces of the first and the second electrode is formed by the cavity plasma generation unit. Therefore, the electric field intensity distribution or the plasma density distribution on the main surface of the electrode can be desirably corrected or controlled by setting a region where the plasma cell exists and other regions in the processing space to a desired layout.

In accordance with the embodiment of the present invention, an inert gas having a low deterioration rate is preferably used as the discharging gas in the cavity.

Further, in the embodiment of the present invention, preferably, an antenna or a third electrode is provided near or in the cavity, and a third high frequency power is applied from a third high frequency power supply to the antenna or the third electrode in order to discharge the gas in the cavity. More specifically, a helical antenna may be disposed around the cavity. When the third high frequency power is supplied from the third high frequency power supply to the helical antenna, an inductively coupled plasma is generated in the cavity by an alternating magnetic field formed around the antenna.

In the present invention, it is possible to control the third high frequency power supplied to the antenna or the third electrode. Besides, the plasma density of the plasma cell can be varied and, further, the dielectric constant of the plasma can be varied.

In accordance with the embodiment of the present invention, an insulator member is preferably provided on a main surface of said one of the first and second electrode to thereby separate a space in the cavity from the processing space. More preferably, the entire wall of the cavity is made of an insulator. The first high frequency wave propagates through the plasma cell surrounded by the insulator which is considered as a lump of dielectric.

Further, in accordance with the embodiment of the present invention, the discharging gas is preferably sealed in the cavity in a depressurized state. In that case, the same discharging gas may be repetitively used for plasma generation.

In accordance with another embodiment of the present invention, the discharging gas is supplied from an external gas supply unit into the cavity while the inside of the cavity is depressurized to a desired pressure by an external gas exhaust system. In this case, it is possible to control the pressure in the cavity, and also possible to variably control the dielectric constant of the plasma in the cavity.

In the present invention, in order to control plasma density spatial distribution characteristics in a radial direction of the processing space, the dielectric constant of the plasma in the cavity is typically controlled by the aforementioned technique.

In the cavity plasma generation unit of the present invention, the shape or the arrangement of the cavity specifying the profile of the plasma cell can be variously selected. In the embodiment of the present invention, the cavity may be of a substantially cylinderical space having a diameter smaller than a diameter of the substrate, and its axis substantially coincides with an axis of the substrate mounted on the first electrode. It may be also possible to employ a configuration in which a thickness of the cavity in a direction perpendicular to the main surface of the electrode changes in a radial direction, e.g., a configuration in which a thickness thereof is largest at the electrode central portion and is gradually reduced toward an outer side of the radial direction.

The configuration around the cavity may be variously changed. For example, an annular dielectric part covering a main surface of said one of the first and second electrode may be provided around the cavity.

In another embodiment of the present invention, there may be employed a configuration in which the cavity is divided into a plurality of subunits, e.g., a configuration in which the cavity includes a substantially cylindrical first cavity subunit which has a diameter smaller than a diameter of the substrate and its axis substantially coincides with an axis substantially same as an axis of the substrate mounted on the first electrode and an annular second cavity subunit provided at an outer side of a radial direction of the first cavity subunit. In that case, it is preferable that the dielectric constants of the plasmas generated in the first and the second cavity unit are controlled independently.

In accordance with the capacitively coupled plasma processing apparatus having the parallel plate electrodes of the present invention, due to the above-described configuration and operation, the plasma density distribution can be easily and freely controlled and, also, the plasma processing uniformity or the production yield can be improved.

BRIEF DESCRIPTION OF THE DRAWINGS

The above and other objects and features of the present invention will become apparent from the following description of embodiments, given in conjunction with the accompanying drawings, in which:

FIG. 6 illustrates still another modification of the cavity plasma generation unit in accordance with the embodiment of the present invention;

FIG. 7 depicts still another modification of the cavity plasma generation unit in accordance with the embodiment of the present invention;

DETAILED DESCRIPTION OF THE EMBODIMENT

The embodiments of the present invention will be described with reference to the accompanying drawings which form a part hereof.

Figure 1:
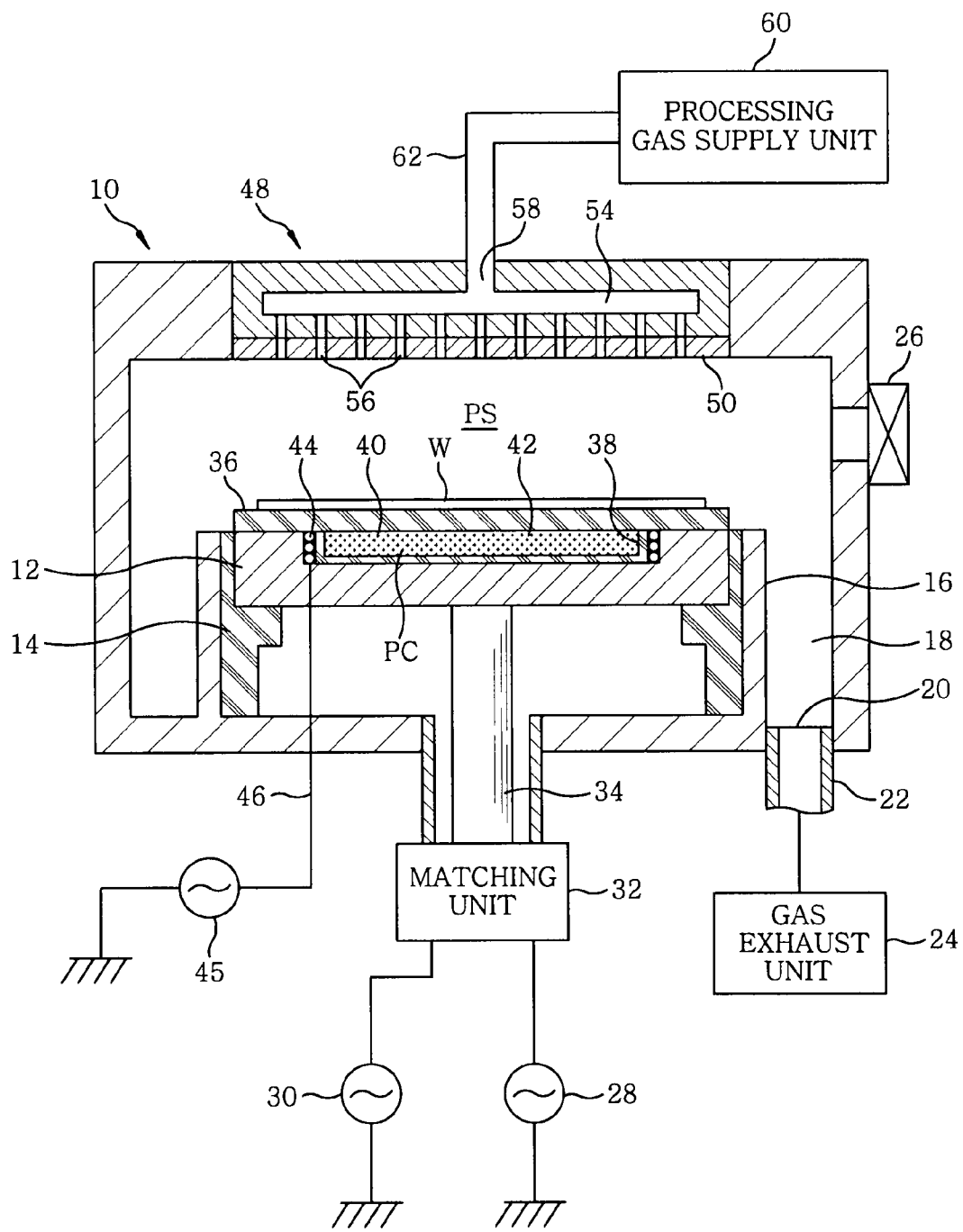
FIG. 1 is a vertical cross sectional view showing a configuration of a plasma etching apparatus in accordance with an embodiment of the present invention.

FIG. 1 shows a configuration of a plasma etching apparatus in accordance with a first embodiment of the present invention. The plasma etching apparatus is configured as a capacitively coupled plasma etching apparatus of cathode coupled type having parallel plate electrodes, and includes a cylindrical chamber (processing vessel) 10 made of a metal such as aluminum, stainless steel or the like. The chamber 10 is frame grounded.

A circular plate-shaped susceptor 12 serving as a lower electrode for mounting thereon a substrate to be processed, e.g., a semiconductor wafer W, is disposed horizontally in the chamber 10. The susceptor 12 is made of, e.g., aluminum, and is supported by a cylindrical insulating supporting portion 14 which is made of ceramic and vertically extends from a bottom of the chamber 10 without being grounded. An annular gas exhaust path 18 is formed between the inner wall of the chamber 10 and the cylindrical conductive supporting portion 16 vertically extending from the bottom of the chamber 10 along the periphery of the cylindrical supporting portion 14. A gas exhaust port 20 is provided at the bottom portion of the gas exhaust path 18, and a gas exhaust unit 24 is connected to the gas exhaust port 20 via a gas exhaust line 22. The gas exhaust unit 24 has a vacuum pump such as a turbo molecular pump or the like, so that a processing space in the chamber 10 can be depressurized to a desired vacuum level. Provided on the sidewall of the chamber 10 is a gate valve 26 for opening and closing a loading/unloading port of the semiconductor wafer W.

A first and a second high frequency power supply 28 and 30 are electrically connected to the susceptor 12 via a matching unit 32 and a power feed rod 34. Here, the first high frequency power supply 28 outputs a first high frequency power of a relatively high frequency wave, e.g., 60 MHz, for plasma generation. Meanwhile, the second high frequency power supply 30 outputs a second high frequency power of a relatively low frequency wave, e.g., 2 MHz, for ion attraction to the semiconductor wafer W on the susceptor 12. The matching unit 32 includes a first matching device for matching an impedance between the first high frequency power supply 28 and a load (mainly, an electrode, a plasma and a chamber) and a second matching device for matching an impedance between the second high frequency power supply 30 and the load.

The susceptor 12 has a diameter larger than that of the semiconductor wafer W. A main surface, i.e., a top surface, of the susceptor 12 is covered by a plate-shaped or film-shaped insulator 36 made of, e.g., quartz or ceramic (hereinafter, referred to as an "insulating plate"). The semiconductor wafer W is mounted on the insulating plate 36.

On the bottom (rear side) of the insulating plate 36, a cavity plasma generation unit 42 having an airtight cavity 40 formed in a cylindrical insulating wall 38 having a quartz or ceramic-made bottom portion is provided in the susceptor 12. The cavity 40 has, as being viewed from the above thereof, a circular cross section of which axis is same as that of the susceptor 12, i.e., that of the semiconductor wafer W mounted on the susceptor 12 (i.e., the cavity is of a substantially cylindrical space). Preferably, the cavity 40 has a diameter smaller than that of the semiconductor wafer W.

In the cavity 40, a discharging inert gas, e.g., Ar gas, is maintained at a predetermined vacuum pressure (e.g., about 66 Pa) and the cavity 40 is sealed. Further, a helical antenna 44 wound in a spiral shape is provided around the insulating wall 38, and a high frequency power supply 45 provided outside the chamber 10 is electrically connected to the helical antenna 44 via a coated line 46 and the like.

The high frequency power supply 45 outputs a third high frequency power of, e.g., a predetermined frequency of about 13.56 MHz, for generating a plasma of the inert gas in the cavity 40. When the third high frequency power from the high frequency power supply 45 is applied to the helical antenna 44, an alternating magnetic field is generated in the cavity 40 by the high frequency current flowing in the antenna 44, thus inducing an electric field. Electrons are accelerated by the induced electric field or the induced magnetic filed, and collide with gas molecules. As a result, the plasma is generated.

Although it is not illustrated, the susceptor 12 may have therein a coolant reservoir or a coolant path where a coolant flows for temperature control. Further, in order to increase wafer temperature accuracy, there may be provided a gas channel for supplying a thermally conductive gas, e.g., He gas, from a thermally conductive gas supply unit to the top surface of the susceptor 12 (the backside of the semiconductor wafer W). In that case, an electrostatic chuck for adsorbing a wafer is provided on the top surface of the susceptor 12.

An upper electrode 48 of a ground potential, which serves as a shower head facing the susceptor 12 in parallel, is installed at the ceiling of the chamber 10. The upper electrode 48 has an electrode plate 50 facing the susceptor 12 and an electrode support 52 for detachably supporting the electrode plate 50 from the rear surface thereof. The electrode support 52 has therein a gas chamber 54, and a plurality of gas discharge openings 56 extending from the gas chamber 54 toward the susceptor 12 are formed in the electrode support 52 and the electrode plate 50. A space between the electrode plate 50 and the susceptor 12 becomes a plasma generation space or a processing space PS. A gas supply line 62 from the processing gas supply unit 60 is connected to a gas inlet port 58 provided at a top portion of the gas chamber 54. Further, the electrode plate 50 is made of, e.g., Si or SiC, and the electrode support 52 is made of, e.g., alumite processed aluminum.

A control unit (not shown) formed of, e.g., a micro computer, controls an operation (sequence) of the entire apparatus and an operation of each unit in the plasma etching apparatus such as the gas exhaust unit 24, the high frequency power supplies 28, 30 and 45, the processing gas supply unit 60 and the like.

To carry out an etching in the plasma etching apparatus, first of all, the gate valve 26 is opened. Next, the semiconductor wafer W to be processed is loaded into the chamber 10 and then is mounted on the susceptor 12. Thereafter, an etching gas (generally a gaseous mixture) from the processing gas supply unit 60 is introduced into the sealed chamber 10 at a predetermined flow rate and flow rate ratio, and the pressure in the chamber 10 is set to be maintained at a predetermined value by the gas exhaust unit 24. Moreover, the first and the second high frequency power supply 28 and 30 are turned on, so that the first high frequency wave (60 MHz) and the second high frequency wave (2 MHz) are outputted at respectively predetermined power levels and supplied to the susceptor (lower electrode) 12 via the matching unit 32 and the power feed rod 34. Meanwhile, the high frequency power supply 45 is turned on to output the third high frequency power (about 13.56 MHz) at a predetermined power level, and the third high frequency wave is supplied to the helical antenna 44 to be applied to the susceptor 12.

In the processing space PS between both electrodes 12 and 48, the etching gas injected through the gas discharge openings 56 of the upper electrode (shower head) 48 is converted into a plasma by the high frequency discharge, and the main surface of the semiconductor wafer W is etched after a predetermined pattern by radicals or ions generated by the plasma.

In the capacitively coupled plasma etching apparatus, by applying the first high frequency power of a relatively high frequency wave, about 60 MHz, for plasma generation on the susceptor 12, a high-density plasma in a desirable dissociation state can be generated even at a relatively low pressure level. At the same time, by applying the second high frequency power of a relatively low frequency, about 2 MHz, for ion attraction, onto the susceptor 12, an anisotropic etching can be performed on the semiconductor wafer W on the susceptor 12 with a high selectivity.

Further, in this plasma etching apparatus, the distribution characteristics of the plasma density in the processing space PS can be easily and freely controlled by the operation of the cavity plasma generation unit 42 provided in the susceptor 12. Hereinafter, the operation of the cavity plasma generation unit 42 will be explained.

As described above, a plasma of an inert gas is generated in the cavity 40 by supplying the third high frequency power from the high frequency power supply 45 to the helical antenna 44 during the etching process. The plasma PC (hereinafter, referred to as a "plasma cell") formed in the cavity 40 is blocked from the processing space PS or from the semiconductor wafer W by the insulating plate 36, and thus does not affect the etching process directly. However, since it is installed on the main surface of the susceptor (high frequency electrode) 12, it functions as a dielectric imposing an impedance on the high frequency wave discharged from the susceptor 12 to the processing space PS, especially to the first high frequency wave for plasma generation.

To be more specific, when the first high frequency power supplied from the high frequency power supply 28 is applied to the susceptor 12 via the power feed rod 34, the RF current flows along the surfaces of the susceptor 12, i.e., from the back surface of the susceptor 12 to the main surface thereof via the side surface by the skin effect. On the top surface of the main surface of the susceptor 12, the RF current flows in the reverse-radial direction from the edge portion toward the central portion while being spontaneously discharged from the main surface thereof to the processing space PS via the insulating plate 36 toward the upper electrode 48 or the sidewall of the chamber 10. In the present embodiment, the plasma cell PC for applying a capacitive impedance is installed at the central portion of the main surface of the susceptor 12. Thus, it is difficult for the RF current flowing from the edge portion to the central portion of the lower electrode to pass the plasma cell PC and, hence, the ratio of the RF current, which is discharged to the processing space PS via the insulating plate 36 before reaching the central portion of the susceptor 12, increases. Accordingly, the plasma density can be increased on the substrate edge portion by enhancing the ionization collision between the electrons and molecules near the substrate edge portion in the processing space PS on the semiconductor substrate W.

As described above, due to the impedance effect of the plasma cell PC provided on the main surface of the susceptor 12, the distribution profile of the plasma density in the processing space PS on the semiconductor substrate W can be adjusted. That is, the plasma density can become uniform in a radial direction on the semiconductor substrate W. Hence, the production yield of the plasma processing can be increased.

Moreover, the major feature of the present embodiment is that the dielectric constant of the plasma cell PC can be simply and quickly changed by varying the third frequency power outputted from the high frequency power supply 45. Accordingly, the impedance effect of the plasma cell PC can be flexibly changed (optimized) depending on various etching processes or changes of the process conditions.

In other words, if a frequency of the first high frequency power and a plasma frequency of the plasma cell PC are denoted by $\omega$ and $\omega_p$, respectively, a relative dielectric constant $\in_p$ of the plasma cell PC is defined by following equations (1) and (2).

$$\in_p = 1 - \omega_p^2/\omega^2 \quad \text{Eq. (1)}$$

$$\omega_p = (e^2 n_o / \in_o m_e)^{1/2} \quad \text{Eq. (2)}$$

Here, e, $n_o$, $\in_o$ and $m_e$ indicate a charge of an electron, a plasma density, a permittivity in vacuum and a mass of an electron, respectively.

In the cavity plasma generation unit 42 of the present embodiment, by varying the third high frequency power outputted from the high frequency power supply 45, the plasma density $n_o$ of the plasma cell PC can be varied and, further, the dielectric constant $\in_p$ of the plasma cell PC can be varied. By varying the dielectric constant $\in_p$ of the plasma cell PC, the impedance characteristics of the plasma cell PC can be varied.

For example, when the frequency of the first high frequency power is further increased, the skin effect in the susceptor 12 is further enhanced. Therefore, the dielectric constant $\in_p$ is reduced by increasing the plasma density $n_o$ by increasing the third high frequency power. Namely, when the dielectric constant $\in_p$ of the plasma cell PC is reduced, the capacitance thereof is decreased. Therefore, the impedance is increased and, hence, it is possible to suppress the concentration of the RF current to the central portion of the main surface of the susceptor 12 due to the skin effect.

Further, by increasing the plasma density $n_o$, the plasma cell PC can be made to play a role of an impedance function or a high frequency shielding function in a region where the dielectric constant $\in_p$ is negative.

In a typical etching process, when a single processing is performed on a single semiconductor wafer, a plurality of steps (e.g., a step of etching a mask on a wafer surface, a step of vertically cutting an insulating film under the mask, a step of applying an overetching by increasing selectivity to a base layer, and the like) are often carried out successively while varying the processing conditions such as pressure, power, gas and the like. In accordance with the present embodiment, the cavity plasma generation unit 42 can be made to function in such a way that the plasma distribution characteristics can be optimized in each of the steps.

FIGS. 2 to 7 illustrate modifications of the cavity plasma generation unit of the present embodiment. In FIGS. 2 to 7, the second high frequency power supply 30 (see FIG. 1) for supplying the second high frequency power for attracting ions to the susceptor 12 is not shown for simplicity of the drawings.

Figure 2:
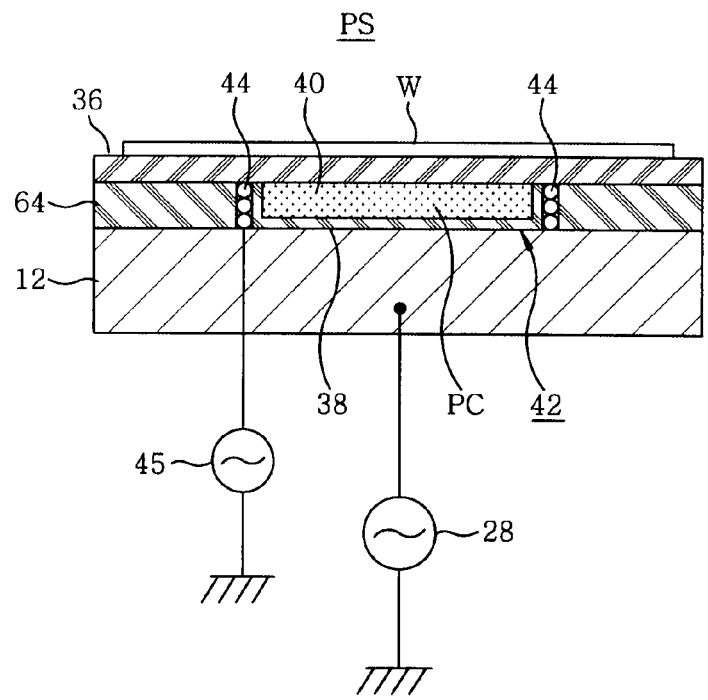
FIG. 2 illustrates a modification of a cavity plasma generation unit in accordance with the embodiment of the present invention.

In the cavity plasma generation unit 42 in FIG. 2, a cavity 40 having a diameter smaller than that of the semiconductor wafer W is formed on the central portion of the top surface of the susceptor 12, and an annular dielectric material 64 made of, e.g., ceramic, is arranged therearound. Further, the top surface of the annular dielectric material 64 and the cavity 40 are covered by the insulating plate 36. An outer diameter of the annular dielectric material 64 may be smaller than or greater than the diameter of the semiconductor wafer W. The annular dielectric material 64 and the insulating plate 36 covering the top surface thereof can be formed as a unit by using the same material.

In the above-described configuration, the first high frequency power supplied from the high frequency power supply 28 flows along the surfaces of the susceptor 12, i.e., from the back surface of the susceptor 12 to the main surface thereof via the side surface by the skin effect. On the top surface of the main surface of the susceptor 12, the RF current flows in the reverse-radial direction from the edge portion toward the central portion while being discharged from the sites of the main surface thereof to the processing space PS via the plasma cell PC and the insulating plate 36 or via the annular dielectric material 64 and the insulating plate 36. In this case, the relative dielectric constant of the annular dielectric (ceramic) material 64 is generally greater than about 3, and is greater than the relative dielectric constant $\in_p$ of the plasma cell PC. That is, the impedance of the annular dielectric 64 material is smaller than that of the plasma cell PC, so that the ratio of the RF current discharged to the processing space PS via the annular dielectric material 64 increases. Accordingly, the plasma density can be increased by enhancing the number of collisions between the electrons and molecules near the substrate edge portion in the processing space PS on the semiconductor substrate W.

In the above configuration as well, the profile of the plasma density distribution in the processing space PS can be easily and freely controlled by varying the third high frequency power supplied from the high frequency power supply 45 to the helical antenna 44 of the cavity plasma generation unit 42, rather than varying the high frequency power from the first high frequency power supply 28.

Figure 3:
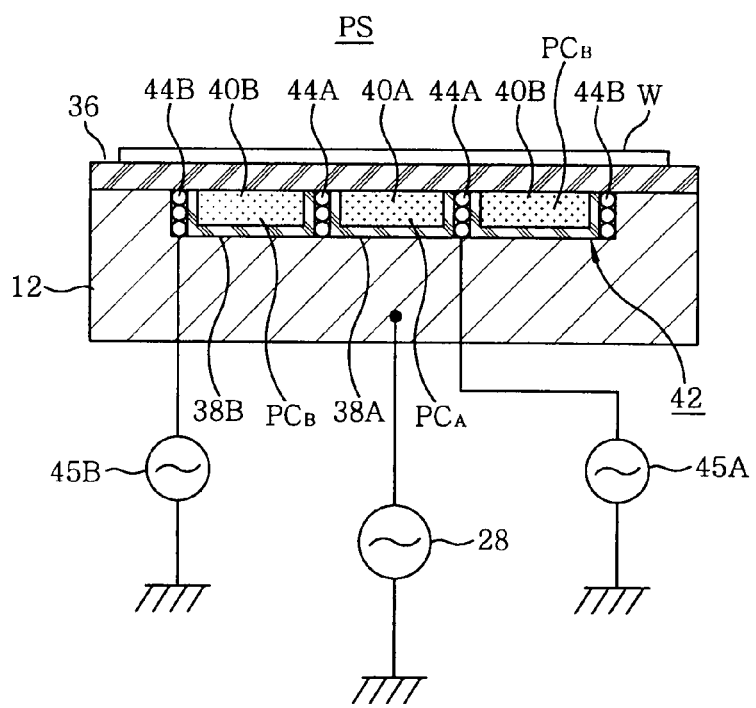
FIG. 3 describes another modification of the cavity plasma generation unit in accordance with the embodiment of the present invention.

The cavity plasma generation unit 42 in FIG. 3 has individual cavities 40A and 40B. In the illustrated configuration example, a circular or cylindrical central cavity 40A having a diameter smaller than that of the semiconductor wafer W is provided at the central portion on the main surface of the susceptor 12, and an annular peripheral cavity 40B is provided therearound. The central cavity 40A is surrounded by a cylindrical insulating wall 38A having a bottom portion, and the peripheral cavity 40B is surrounded by an annular insulating wall 38B having a bottom portion. In addition, top surfaces of both cavities 40A and 40B are airtightly covered by the insulating plate 36.

A discharging inert gas is sealed in both cavities 40A and 40B at respective independent vacuum pressures. Moreover, a central helical antenna 44A is disposed at between the peripheral cavity 40B and the central cavity 40A, and a peripheral helical antenna 44B is disposed around the peripheral cavity 40B. Both helical antennas 44A and 44B may be supplied with individual powers of different frequencies from third high frequency power supplies 45A and 45B.

In the above-described configuration, an inductively coupled inert gas plasma is generated in the central cavity 40A by applying a third high frequency power from the third high frequency power supply 45A to the central helical antenna 44A. Further, an inductively coupled inert gas plasma is generated in the peripheral cavity 40B by applying a third high frequency power from the third high frequency power supply 45B to the peripheral helical antenna 44B. The dielectric constants of the plasma cells $PC_A$ and $PC_B$ generated in the cavities 40A and 40B can be varied individually by varying the third high frequency powers individually.

Further, in the above configuration, the dielectric constants of both plasma cells $PC_A$ and $PC_B$ or the impedances thereof can be appropriately varied by appropriately selecting winding direction of the helical antennas 44A and 44B or a phase difference between the third high frequencies outputted from the third high frequency power supplies 45A and 45B.

Figure 4:
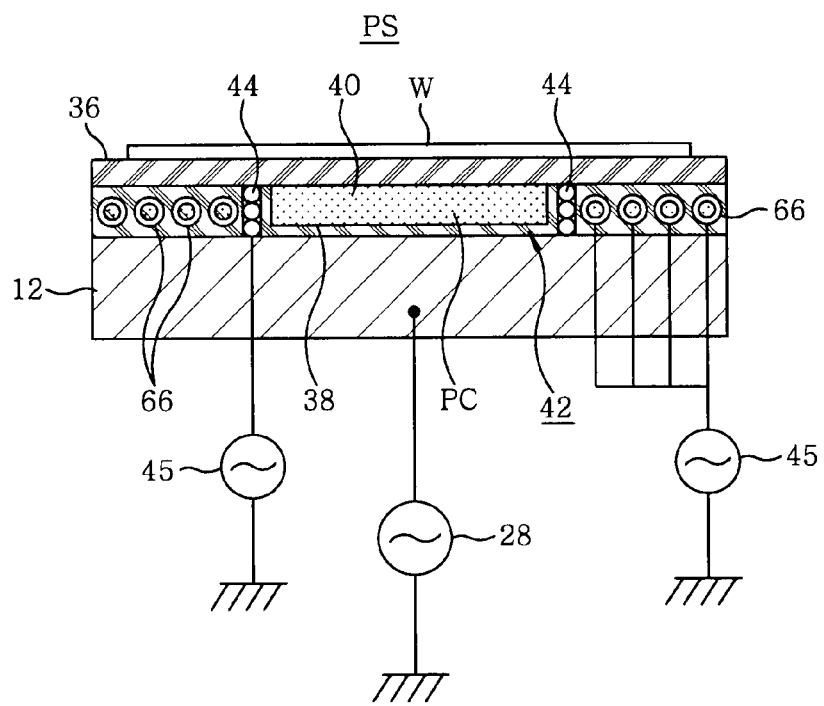
FIG. 4 depicts still another modification of the cavity plasma generation unit in accordance with the embodiment of the present invention.

The cavity plasma generation unit 42 in FIG. 4 is obtained by combining modified configurations of FIGS. 2 and 3. To be more specific, one or more ring-shaped discharge tubes 66 are provided around the cavity 40 in FIG. 2, and plasmas are generated by glow-discharging or arc-discharging an inert gas in each of the discharge tubes 66. An AC power supply 45C for supplying a power to electrodes of the discharge tubes 66 outputs an AC power of a relatively low frequency (a low frequency of, e.g., from an electrode power frequency to about 100 kHz) suitable for a glow discharge or an arc discharge, and is configured as a variable power supply so that the plasma density in the discharge tubes can be varied. The discharge tubes 66 may be constructed as DC discharge tubes 66. In that case, the AC power supply may be replaced by a DC power supply.

Figure 5:
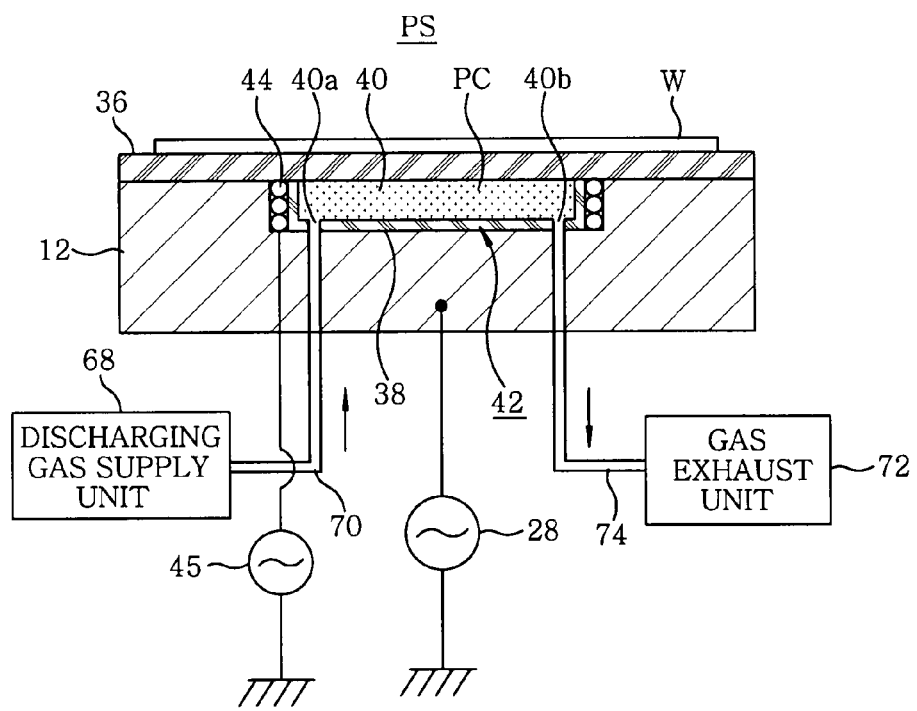
FIG. 5 shows still another modification of the cavity plasma generation unit in accordance with the embodiment of the present invention.

The cavity plasma generation unit 42F in FIG. 5 is characterized in that the pressure in the cavity 40 can be varied by introducing and releasing a discharging inert gas into and from the cavity 40. In the illustrated configuration example, a gas inlet port 40a and a gas exhaust port 40b are formed at both end portions of the bottom of the cavity 40. Further, a discharging inert gas is introduced from a discharging gas supply unit 68 installed outside the chamber 10 into the cavity 40 at a variable flow rate via a gas supply line 70 and the gas inlet port 40a. Then, the inside of the cavity 40 is exhausted at a variable exhaust rate by a gas exhaust unit 72 having a vacuum pump therein provided outside the chamber 10 via the gas exhaust port 40b and a gas exhaust line 74. Accordingly, a plasma of an inert gas can be generated in a state where the inside of the cavity 40 is set to a desired or variable vacuum pressure. By varying the pressure in the cavity 40, the plasma density $n_o$ of the plasma cell PC can be varied and, further, the dielectric constant $\in p$ can be varied. It is also possible to control the pressure in the cavity 40 as well as the third frequency power together.

In the cavity plasma generation unit 42 in FIG. 6, the shape of the cavity 40 is modified. For example, as illustrated, a surface of the insulating wall 38 is formed in a concave shape. Accordingly, a thickness (height) of the cavity 40 is largest at the central portion, and is gradually reduced toward an outer side of the radial direction.

In the cavity plasma generation unit 42 in FIG. 7, a modification of a discharging antenna is illustrated. For example, as illustrated, a planar spiral antenna 76 may be provided at the bottom of the cavity 40.

Figure 8:
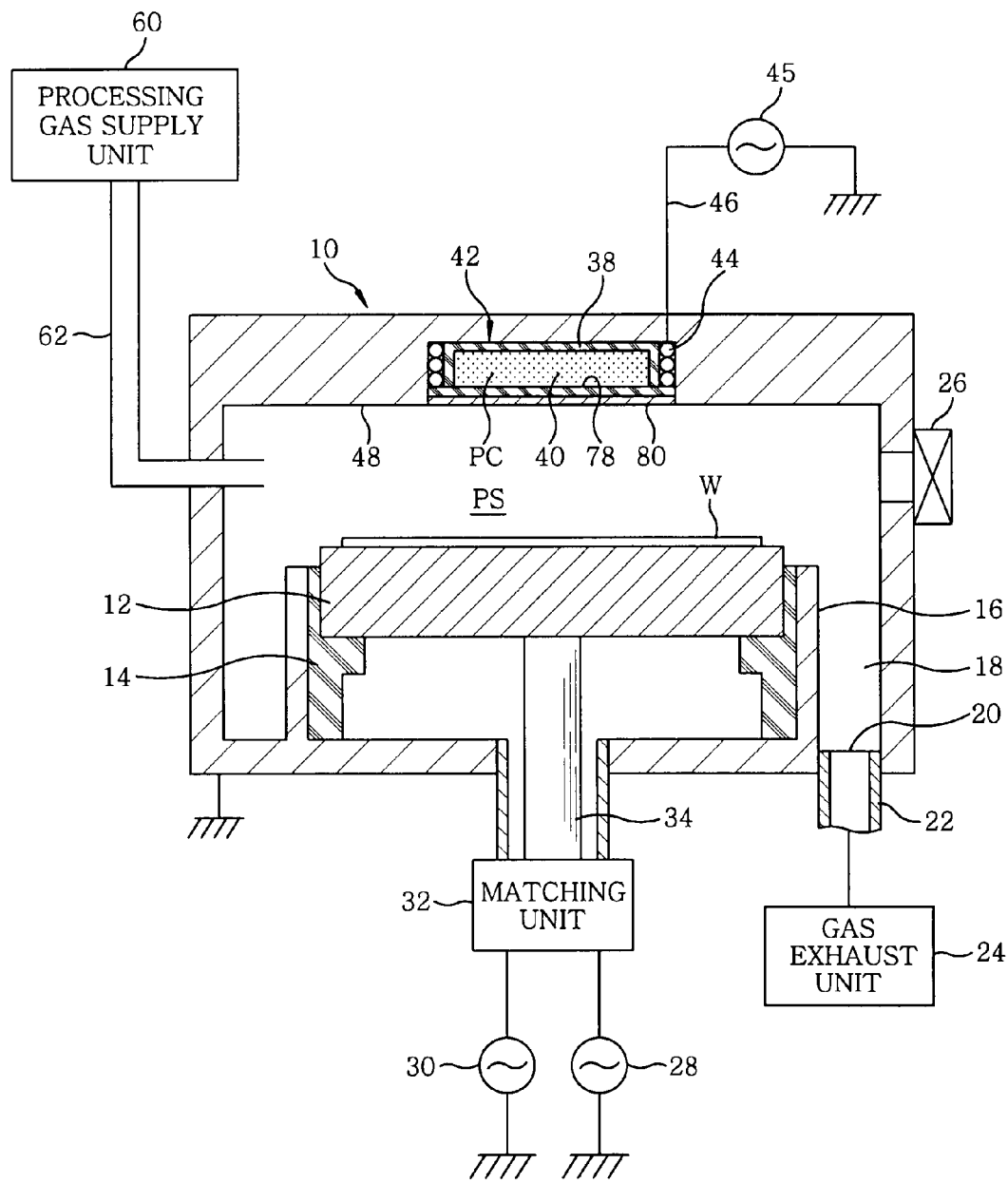
FIG. 8 shows modifications of the plasma etching apparatus and the cavity plasma generation unit in accordance with the embodiment of the present invention.
Figure 9:
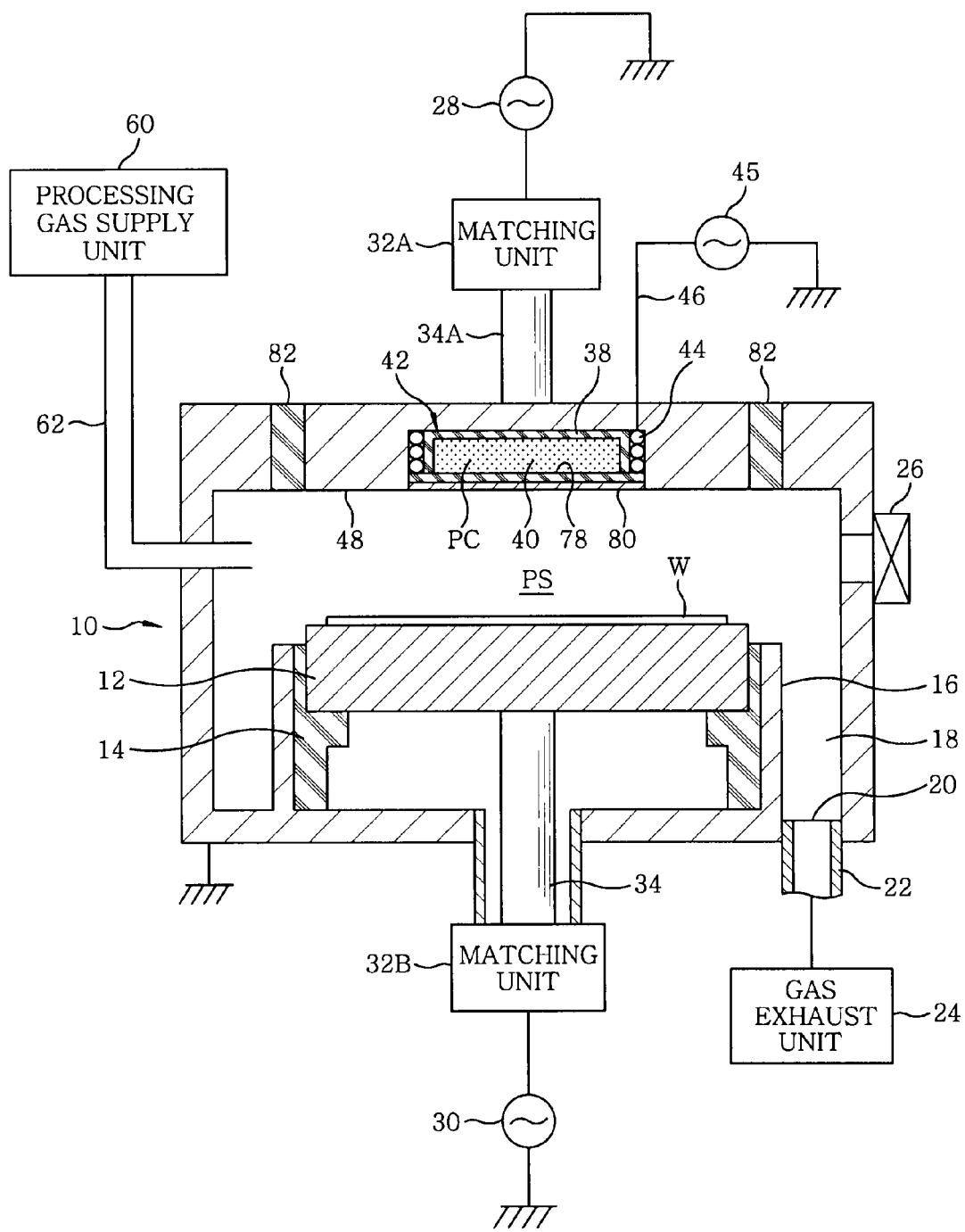
FIG. 9 describes other modifications of the plasma etching apparatus and the cavity plasma generation unit in accordance with the embodiment of the present invention.

FIGS. 8 and 9 depict configuration examples in which the cavity plasma generation unit 42 of the present embodiment is provided in the upper electrode.

FIG. 8 shows a configuration example in which the cavity plasma generation unit 42 is provided in the upper electrode 48 of a ground potential in the plasma etching apparatus employing a lower electrode dual frequency application type in FIG. 1. In that case, the cavity plasma generation unit 42 is provided directly above the semiconductor wafer W mounted on the susceptor 12 to be coaxial therewith. The bottom surface of the bottom wall of the cavity 40 is exposed to the processing space PS and thus is easily made to sputter. Therefore, it is preferable that the inner side of the bottom wall is formed of an insulator 78, and that an electrode plate 80 made of, e.g., Si or SiC, is detachably provided on the bottom surface of the insulator 78. Instead of the two-layer structure of the insulator 78 and the electrode plate 80, a single layer structure made of quartz may be provided. In addition, the cavity plasma generation unit 42 can be modified as shown in FIGS. 3 to 7.

FIG. 9 illustrates a configuration in which the first high frequency power 28 for plasma generation is applied to the upper electrode 48. In that case, the upper electrode 48 can be attached in an electrically floating state to the chamber 10 via an insulating member 82. The high frequency power supply 28 which outputs the first high frequency power is electrically connected to the upper electrode 48 via a matching unit 32A and an upper power feed rod 34A. The cavity plasma generation unit 42 itself may have the configuration of FIG. 8. Further, both of the upper electrode 48 and the lower electrode 12 may have the cavity plasma generation unit 42.

Further, in the configuration example of FIGS. 8 and 9, the gas supply line 62 from the processing gas supply unit 60 is connected to the sidewall of the chamber 10, and the processing gas is injected sidewise from the side wall into the processing space PS. However, it is also possible to provide a shower head at the upper portion of the chamber 10, wherein the shower head may be provided around the cavity plasma generation unit 42 and also may be provided at the bottom wall of the cavity plasma generation unit 42. Moreover, the high frequency power supply 30 for supplying the second high frequency for ion attraction to the susceptor 12 can be omitted.

In the aforementioned embodiments, an inert gas of a low consumption deterioration rate can be preferably used as a discharging gas of the cavity plasma generation unit 42. However, if necessary, a reactive gas may be used instead thereof or be mixed therewith to be used.

Moreover, in the above embodiments, a dedicated high frequency power (third high frequency power) is used to discharge a gas in the cavity 40 in the cavity plasma generation unit 42. However, the high frequency, which is applied to the high frequency electrode (the first or the second electrode) to generate a plasma in the processing space PS, may be used for generation of a plasma cell in the cavity plasma generation unit 42. In that case, the third high frequency power supply 45 and/or the antennas 44 and 76 may be omitted.

The present invention is not limited to the plasma etching apparatus, and can also be applied to other plasma processing apparatuses for performing plasma CVD, plasma oxidation, plasma nitriding, sputtering and the like. Further, as for a substrate to be processed of the present invention, it is possible to use various substrates for flat panel display, a photomask, a CD substrate, a printed circuit board and the like, other than a semiconductor wafer.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
    a vacuum evacuable processing chamber;
    a first electrode configured to mount thereon a substrate to be processed in the processing chamber;
    a second electrode facing the first electrode in parallel in the processing chamber;
    a processing gas supply unit configured to supply a processing gas to a processing space between the first and the second electrodes;
    a first high frequency power supply configured to apply a first high frequency power for generating, in the processing space, a plasma of the processing gas to at least one of the first and the second electrodes;
    a cavity plasma generation unit, having a cavity formed in one of the first and the second electrodes, configured to generate, in the cavity, a plasma of a discharging gas; and
    an insulator member provided on a main surface of said one of the first and the second electrodes including the cavity to separate a space in the cavity from the processing space such that the cavity is not in fluid communication with the processing space.

2. The plasma processing apparatus of claim 1, wherein the discharging gas in the cavity is an inert gas.

3. The plasma processing apparatus of claim 1, further comprising a second high frequency power supply configured to apply, to at least one of the first and the second electrodes, a second high frequency power for attracting ions in the plasma from the processing space onto the substrate.

4. The plasma processing apparatus of claim 1, further comprising:
    an antenna or a cavity electrode provided near or in the cavity; and
    a cavity high frequency power supply configured to apply a cavity high frequency power to the antenna or the cavity electrode to generate the plasma of the discharging gas in the cavity.

5. The plasma processing apparatus of claim 4, wherein the antenna is a helical antenna disposed around the cavity, and an inductively coupled plasma is generated in the cavity.

6. The plasma processing apparatus of claim 4, wherein the cavity frequency power supplied to the antenna or the cavity electrode is controlled to control a dielectric constant of the plasma in the cavity.

7. The plasma processing apparatus of claim 6, wherein the dielectric constant of the plasma in the cavity is controlled to control spatial distribution characteristics of plasma density in a radial direction of the processing space.

8. The plasma processing apparatus of claim 1, wherein the entire cavity is airtightly sealed by an insulator.

9. The plasma processing apparatus of claim 1, wherein the discharging gas is airtightly sealed in the cavity in a depressurized state.

10. The plasma processing apparatus of claim 1, further comprising:
    a gas supply unit configured to supply the discharging gas into the cavity; and
    a gas exhaust unit configured to depressurize an inside of the cavity to a required pressure.

11. The plasma processing apparatus of claim 10, wherein a pressure in the cavity is controlled to control a dielectric constant of the plasma in the cavity.

12. The plasma processing apparatus of claim 11, wherein the dielectric constant of the plasma in the cavity is controlled to control spatial distribution characteristics of plasma density in a radial direction of the processing space.

13. The plasma processing apparatus of claim 1, wherein the cavity is of a substantially cylindrical space having a diameter smaller than a diameter of the substrate, an axis of the cavity substantially coinciding with an axis of the substrate mounted on the first electrode.

14. The plasma processing apparatus of claim 13, wherein a thickness of the cavity in a direction perpendicular to a main surface of said one of the first and the second electrodes including the cavity changes in a radial direction of the cavity.

15. The plasma processing apparatus of claim 1, further comprising, around the cavity, an annular dielectric member covering a main surface of said one of the first and the second electrodes including the cavity.

16. The plasma processing apparatus of claim 1, wherein the cavity includes:
    a substantially cylindrical first cavity subunit which has a diameter smaller than a diameter of the substrate and an axis of the substantially cylindrical first cavity subunit substantially coincides with an axis of the substrate mounted on the first electrode; and
    an annular second cavity subunit provided at an outer side of a radial direction of the first cavity subunit.

17. The plasma processing apparatus of claim 16, wherein dielectric constants of plasmas generated in the first and the second cavity subunits are controlled independently.

18. The plasma processing apparatus of claim 1, further comprising an additional cavity in the other of the first and the second electrodes and a gas plasma that is generated in the additional cavity.

19. The plasma processing apparatus of claim 1, wherein the plasma of the processing gas is a capacitively coupled plasma.

* * * * *